(12) United States Patent
Auyeung et al.

(10) Patent No.: US 6,805,918 B2
(45) Date of Patent: *Oct. 19, 2004

(54) LASER FORWARD TRANSFER OF RHEOLOGICAL SYSTEMS

(75) Inventors: Raymond C. Y. Auyeung, Alexandria, VA (US); Alberto Pique, Crofton, MD (US); Henry Daniel Young, College Park, MD (US); Rohit Modi, Arlington, VA (US); Huey-Daw Wu, Fairfax, VA (US); Douglas B. Chrisey, Bowie, MD (US); James M. Fitz-Gerald, Schuyler, VA (US); Bradley R. Ringeisen, Alexandria, VA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/141,820

(22) Filed: May 10, 2002

(65) Prior Publication Data

US 2002/0197401 A1 Dec. 26, 2002

Related U.S. Application Data

(60) Continuation-in-part of application No. 10/068,315, filed on Feb. 8, 2002, which is a continuation-in-part of application No. 09/671,166, filed on Sep. 28, 2000, which is a division of application No. 09/318,134, filed on May 25, 1999, now Pat. No. 6,177,151.
(60) Provisional application No. 60/290,400, filed on May 11, 2001, and provisional application No. 60/117,468, filed on Jan. 27, 1999.

(51) Int. Cl.$^7$ .................. C23C 14/30; C23C 14/28; B05D 3/00

(52) U.S. Cl. .................. 427/596; 427/595; 427/554; 427/555

(58) Field of Search .................. 427/596, 595, 427/554, 555, 597, 582, 583, 584, 553, 556

(56) References Cited

U.S. PATENT DOCUMENTS

| | | | |
|---|---|---|---|
| 3,745,586 A | | 7/1973 | Braudy |
| 4,702,958 A | | 10/1987 | Itoh et al. |
| 4,895,735 A | | 1/1990 | Cook |
| 4,970,196 A | | 11/1990 | Kim et al. |
| 4,987,006 A | * | 1/1991 | Williams et al. ............. 427/597 |
| 5,292,559 A | * | 3/1994 | Joyce et al. ................. 427/597 |
| 5,308,737 A | * | 5/1994 | Bills et al. .................. 430/201 |
| 5,492,861 A | | 2/1996 | Opower |
| 5,567,336 A | | 10/1996 | Tatah |
| 5,725,914 A | | 3/1998 | Opower |
| 5,736,464 A | | 4/1998 | Opower |
| 5,741,560 A | * | 4/1998 | Ross .......................... 427/555 |
| 5,757,313 A | | 5/1998 | Meneghini et al. |
| 5,985,377 A | * | 11/1999 | Corbett ....................... 427/511 |
| 6,025,036 A | * | 2/2000 | McGill et al. ............... 427/492 |
| 6,159,832 A | * | 12/2000 | Mayer ......................... 438/584 |
| 6,177,151 B1 | * | 1/2001 | Chrisey et al. .............. 427/596 |
| 6,495,195 B2 | * | 12/2002 | Baer et al. ................... 427/2.11 |

OTHER PUBLICATIONS

Meneghini et al, "Transfer Printing Medium", International Application PCT/US94/11345, Filed Oct. 6, 1994.
Murat, "Laser Applied Surface Film", Foriegn Patent 2,113, 336 Sep. 30, 1971.

(List continued on next page.)

*Primary Examiner*—Shrive P. Beck
*Assistant Examiner*—Eric B. Fuller
(74) *Attorney, Agent, or Firm*—John J. Karasek; Joseph T. Grunkemeyer (57) ABSTRACT

A method for laser transfer and deposition of a rheological fluid wherein laser energy strikes a target substrate comprising a rheological fluid, causing a portion of the rheological fluid to evaporate and propel non-evaporated rheological fluid onto a receiving substrate.

29 Claims, 2 Drawing Sheets

OTHER PUBLICATIONS

H.D. Young et al, "Jetting Behavior in the Laser Forward, Transfer Of Rheological Fluids", Provisional Application 60/327,733 Filed Oct. 4, 2001.

Auyeung et al, "Laser Forward Transfer of Rheological Systems", Provisional Application 60/290,400 Filed May 5, 2001.

Ringeisen et al, "Generation of Viable Cell Active Biomaterial Patterns By Laser Transfer ", Non–Provisional Application 10/068,315 File Feb. 8, 2002.

Ringeisen et al, "Generation of Biomaterial Microarrays By Laser Transfer", Non–Provisional Application 10/068,364 File Feb. 8, 2002.

D. Young et al, "Time–Resolved Optical Microscopy of a Laser–Based Forward Transfer Process", Applied Physics Letters, May 2001, vol. 78 pp. 3169–3171.

Ringeisen et al, "Generation of Mesoscopic Patterns of Viable *Escherichia coli* by Ambient Laser", Biomaterials 23 (2002) pp. 161–166.

* cited by examiner

LASER FORWARD TRANSFER OF RHEOLOGICAL SYSTEMS

This nonprovisional application is a continuation-in-part application of U.S. patent application Ser. No. 10/068,315 filed on Feb. 8, 2002, which is a continuation-in-part application of U.S. patent application Ser. No. 09/671,166 filed on Sep. 28, 2000, which is a divisional application of U.S. patent application Ser. No. 09/318,134, now U.S. Pat. No. 6,177,151 filed on May 25, 1999, which claims benefit of U.S. provisional patent application No. 60/117,468 filed on Jan. 27, 1999. This application also claims benefit of U.S. provisional patent application No. 60/290,400 filed on May 11, 2001 as to certain matter. All applications and patents named above are incorporated herein by reference.

BACKGROUND OF THE INVENTION

1. Field of the Invention

The invention relates generally to a laser transfer method for the deposition of a rheological fluid or system onto a substrate.

2. Description of the Prior Art

A direct-write process is a technique which allows the creation of a pattern and the transfer of material simultaneously onto a given surface or substrate. To be most useful, it does not require any masks or pre-existing form and is usually done under ambient temperature and pressure conditions. Direct-write technologies have been developed in response to a need in the electronics industry for a means to rapidly prototype passive circuit elements on various substrates, especially in the mesoscopic regime, that is, electronic devices that straddle the size range between conventional microelectronics (sub-micron-range) and traditional surface mount components (10+ mm-range). (Direct-writing may also be accomplished in the sub-micron range using electron beams or focused ion beams, but these techniques, because of their small scale and vacuum requirements, are not appropriate for large-scale rapid prototyping.) Direct-writing allows for circuits to be prototyped without iterations in photolithographic mask design and allows the rapid evaluation of the performance of circuits too difficult to accurately model. Further, direct-writing allows for the size of printed circuit boards and other structures to be reduced by allowing passive circuit elements to be conformally incorporated into the structure. Direct-writing can be controlled with CAD/CAM programs, thereby allowing electronic circuits to be fabricated by machinery operated by unskilled personnel or allowing designers to move quickly from a design to a working prototype. Mesoscopic direct-write technologies have the potential to enable new capabilities to produce next generation applications in the mesoscopic regime. Other applications of direct-write technologies in microelectronic fabrication include forming ohmic contacts, forming interconnects for circuit and photolithographic mask repair, device restructuring and customization, design and fault correction.

Currently known direct-write technologies for adding materials to a substrate include ink jet printing, Micropen, laser induced forward transfer (LIFT), laser chemical vapor deposition (LCVD), laser particle guidance (Optomec, Inc.), and laser engineered nano-shaping (LENS). Currently known direct-write technologies for removing material from a substrate include laser machining, laser trimming, and laser drilling.

The direct-writing techniques of ink jet printing, screen-printing, and Micropen are wet techniques, that is, the material to be deposited is combined with a solvent or binder and is applied onto a substrate. In the case of ink jet printing, inks with very low viscosity are required so that they can be forced through nozzles via mechanical or thermal forces. In the case of screen-printing and Micropen, inks with relatively high viscosities are required so as to minimize their spreading once applied to the substrate. The solvent or binder must later be removed by a drying or curing process, which limits the flexibility and capability of these approaches. In all these techniques, only inks within a narrow range of viscosity can be used and therefore the choices of materials or formulations that can be transferred are rather limited.

In the direct-writing technique known as "laser induced forward transfer" (LIFT), a pulsed laser beam is directed through a laser-transparent target substrate to strike a film of material coated on the opposite side of the target substrate. The laser vaporizes the film material as it absorbs the laser radiation and, due to the transfer of momentum, the material is removed from the target substrate and is redeposited on a receiving substrate that is placed in proximity to the target substrate. Laser induced forward transfer is typically used to transfer opaque thin films, typically metals, from a pre-coated laser transparent support, typically glass, $SiO_2$, $Al_2O_3$, $SrTiO_3$, etc., to the receiving substrate. Various methods of laser-induced forward transfer are described in, for example, the following U.S. patents and publications incorporated herein by reference: U.S. Pat. No. 4,752,455 to Mayer, U.S. Pat. No. 4,895,735 to Cook, U.S. Pat. No. 5,725,706 to Thoma et al., U.S. Pat. No. 5,292,559 to Joyce, Jr. et al., U.S. Pat. No. 5,492,861 to Opower, U.S. Pat. No. 5,725,914 to Opower, U.S. Pat. No. 5,736,464 to Opower, U.S. Pat. No. 4,970,196 to Kim et al., U.S. Pat. No. 5,173,441 to Yu et al., and Bohandy et al., "Metal Deposition from a Supported Metal Film Using an Excimer Laser, J. Appl. Phys. 60 (4) Aug. 15, 1986, pp 1538–1539. Because the film material is vaporized by the action of the laser, laser induced forward transfer is inherently a pyrolytic technique used to deposit simple one-component materials and typically cannot be used to deposit complex crystalline, multi-component materials as they tend to decompose when vaporized and may become amorphous upon condensation. Moreover, because the material to be transferred is vaporized, it becomes more reactive and can more easily become degraded, oxidized, or contaminated. The method is not well suited for the transfer of organic materials, since many organic materials are fragile, thermally labile, and can be irreversibly damaged during deposition. Moreover, functional groups on an organic polymer can be irreversibly damaged by direct exposure to laser energy. Other disadvantages of the laser induced forward transfer technique include poor uniformity, morphology, adhesion, and resolution. Further, because of the high temperatures involved in the process, there is a danger of ablation or sputtering of the support, which can cause the incorporation of impurities in the material that is deposited onto the receiving substrate. Another disadvantage of laser induced forward transfer is that it typically requires that the coating of the material to be transferred be a thin coating, generally less than 1 μm thick. Because of this requirement, it is very time-consuming to transfer large amounts of material. Finally, LIFT was not designed originally for the transfer of rheological systems. The art of applying a solid coating to the target substrate was already well established in the field and a rheological coating as described in this invention would have added extra complexity to its manufacture, use, and storage.

In a simple variation of laser induced forward transfer, the target substrate is coated with several layers of materials.

The outermost layer, that is, the layer closest to the receiving substrate, consists of the material to be deposited and the innermost layer consists of a material that absorbs laser energy and becomes vaporized, causing the outermost layer to be propelled against the receiving substrate. Variations of this technique are described in, for example, the following U.S. patents and publications incorporated herein by reference: U.S. Pat. No. 5,171,650 to Ellis et al., U.S. Pat. No. 5,256,506 to Ellis et al., U.S. Pat. No. 4,987,006 to Williams et al., U.S. Pat. No. 5,156,938 to Foley et al. and Tolbert et al., "Laser Ablation Transfer Imaging Using Picosecond Optical pulses: Ultra-High Speed, Lower Threshold and High Resolution" Journal of Imaging Science and Technology, Vol.37, No.5, Sept./Oct. 1993 pp.485–489. A disadvantage of this method is that, because of the multiple layers, it is difficult or impossible to achieve the high degree of homogeneity of deposited material on the receiving substrate required, for example, in the construction of electronic devices, sensing devices or passivation coatings. In addition, the multiple layers tend to leave residues that may contaminate the transferred material or degrade its properties.

The direct-write technique called laser chemical vapor deposition (LCVD) utilizes a laser beam focused on the surface of a substrate to induce localized chemical reactions. Usually the surface of the substrate is coated with a metal-organic precursor, which is either pyrolyzed or photolyzed locally where the laser beam scans. Pyrolytic LCVD involves essentially the same mechanism and chemistry as conventional thermal LCVD, and it has found major use in direct-writing of thin films for semiconductor applications. In photolytic LCVD, the chemical reaction is induced by the interaction between the laser light and the precursors. A limitation of both processes is that they must be carried out under controlled atmospheres such as inside a vacuum system, and they tend to exhibit slow deposition rates. In addition they are not well suited for direct-write applications where multilayers of dissimilar types of materials need to be produced.

The direct-write technique called laser engineered nano-shaping (LENS) utilizes a laser beam to melt powders of various materials as they come in contact with the substrate surface. LENS is a process that works well for making thick layers of metals. However, the high melting points exhibited by most ceramics required the use of high power laser beams, which cause the overheating of the substrate and surrounding layers. Furthermore, many ceramics once melted will not exhibit their original crystalline structure after solidification. In addition, because the materials being deposited must first melt and then resolidify, the layers are under large stresses, which cause their delamination.

All these techniques involve the laser transfer of matter that is not deliberately subject to any type of deformation or flow. Rather, the matter is subject either to changes in phase, i.e. solid to vapor or to change in composition, i.e. decomposition of a matrix. At present there is no record of the use of lasers to forward transfer rheological systems, i.e. fluids, gels, or pastes, taking advantage of the rheological properties, for the purpose of laser direct-write applications.

The wet techniques described above cannot make a pattern with a resolution on the order of a few microns. The laser transfer techniques described above cannot be used with a rheological fluid. There remains a need for a laser transfer method that can produce a pattern of a rheological fluid with a resolution on the order of a few microns.

U.S. Pat. No. 6,177,151 to Chrisey et al. discloses the MAPLE-DW (Matrix Assisted Pulsed Laser Evaporation Direct-Write) method and apparatus. The method comprises the use of laser energy to cause a composite material to volatilize, desorb from a laser-transparent support, and be deposited on a receiving substrate. The composite material comprises a matrix material and a transfer material. The transfer material is the material desired to be transferred to the receiving substrate. The matrix material is more volatile than the transfer material and binds the transfer material into the composite material. The laser energy causes the matrix material to volatilize and propel the transfer material onto the receiving substrate. The properties of the transfer material are preserved after deposition. This method will be further described in the Detailed Description of the Preferred Embodiments below. U.S. Pat. No. 6,177,151 is primarily directed to the transfer of solid composite materials.

In the prior use of MAPLE-DW, the materials of interest are contained in a solid matrix coating on one side of a target substrate. The laser pulse impacts this layer and transfers the materials of interest to an acceptor substrate while decomposing the volatile components. Due to the solid form of this matrix coating, there is less densification and increased spatial scatter of the material after the transfer process. The loosely consolidated nature of the transferred material also results in poor adhesion to the substrate and poor intrinsic mechanical strength as well. A rheological fluid could result in transfers with better spatial resolutions, less debris, smoother and more uniform cross-sectional profile, higher density, improved functional properties, and adhesion to the substrate.

U.S. patent application Ser. No. 10/068,315 filed on Feb. 8, 2002 by Ringeisen et al., also a continuation-in-part application of U.S. patent application Ser. No. 09/671,166, discloses the use of MAPLE-DW where the matrix material is a rheological fluid, but only when the transfer material is living or active biomaterial.

SUMMARY OF THE INVENTION

It is an object of the invention to provide methods for depositing a rheological fluid on a receiving substrate using a laser forward transfer apparatus that can produce a pattern with a resolution on the order of a few microns.

It is a further object of the invention that the method use laser fluences lower than that required by other laser transfer methods.

It is a further object of the invention that the method allow for higher density and linewidth definition in the transferred material.

These and other objects of the invention are accomplished by a method for laser deposition comprising the steps of: providing a receiving substrate; providing a target substrate; wherein the target substrate comprises a laser-transparent support coated with a coating on a surface facing the receiving substrate; and exposing the coating to laser energy through the laser-transparent support at a defined target location comprising a rheological fluid to evaporate a portion of the rheological fluid adjacent to the laser-transparent support at the defined target location; wherein the non-evaporated rheological fluid at the defined target location is propelled by the evaporated rheological fluid away from the laser-transparent support and toward the receiving substrate; and wherein the non-evaporated rheological fluid is deposited at a defined receiving location on the receiving substrate to form a deposit.

BRIEF DESCRIPTION OF THE DRAWINGS

FIGS. 3a and 3b are schematic representations of a defined machining location 28 on a receiving substrate 18 (3a) made using the apparatus of FIG. 1b, and a deposit 26 in a defined machining location 28 (3b) made using the apparatus of FIG. 1a.

LIST OF REFERENCE NUMBERS

| | |
|---|---|
| 12 | laser |
| 14 | laser energy |
| 15 | laser-transparent support |
| 16 | coating |
| 17 | target substrate |
| 18 | receiving substrate |
| 20 | laser positioning means |
| 22 | target substrate positioning means |
| 24 | receiving substrate positioning means |
| 26 | deposit |
| 28 | defined machining location |
| 30 | rear surface |
| 32 | support surface |
| 34 | back surface |
| 36 | front surface |

DETAILED DESCRIPTION OF THE PREFERRED EMBODIMENTS

Basic Method

Figure 1A:
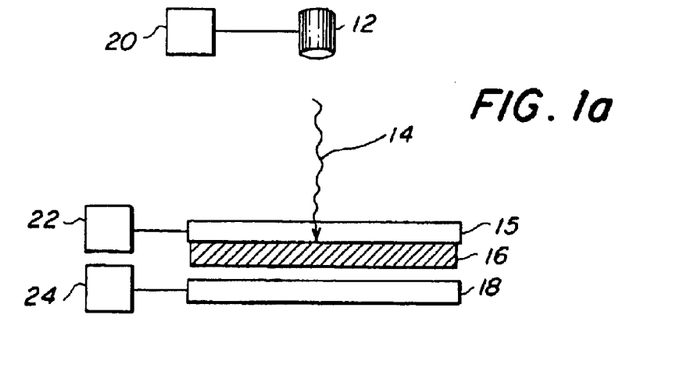
FIG. 1a is a schematic representation of a MAPLE-DW apparatus when used to transfer a coating 16 comprising a rheological fluid to a receiving substrate 18.
Figure 4:
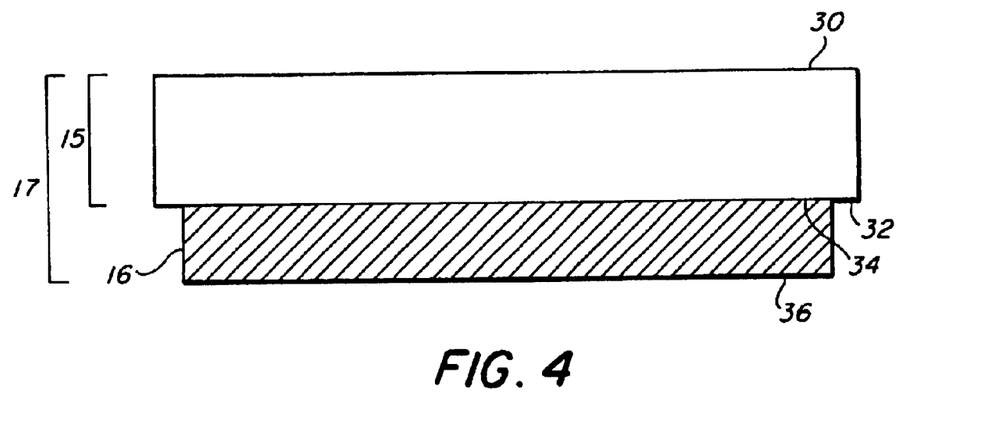
FIG. 4 is a detailed schematic representation of a target substrate 17 showing the laser-transparent support 15, and composite material 16.

FIG. 1a schematically illustrates a MAPLE-DW apparatus used in the present invention. The apparatus includes a source of laser energy 12 that produces laser energy 14, a target substrate 17, and a receiving substrate 18. Typically, the receiving substrate 18 is positioned opposite the source of laser energy 12. Typically, the target substrate 17 is positioned between the receiving substrate 18 and the source of laser energy 12. FIG. 4 schematically illustrates the target substrate in detail. The target substrate 17 comprises two layers: a laser-transparent support 15 and a coating 16. The laser-transparent support 15 has a support surface 32 that faces the receiving substrate 18 and a rear surface 30 on the opposite side of the laser-transparent support 15 from the support surface 32. The coating 16 has a back surface 34 in contact with the support surface 32 and a front surface 36 facing the receiving substrate 18.

The method of the invention for laser deposition comprises the steps of: providing a receiving substrate 18, providing a target substrate 17, and exposing the coating 16 to laser energy 14.

In the step of exposing the coating 16, laser energy 14 passes through the laser-transparent support 15 to strike the coating 16 at a defined target location. The coating 16 at the defined target location comprises a rheological fluid. A rheological fluid or system as used herein refers to a class of materials that exhibits phenomena lying in a range between that of a solid and a liquid. A rheological material is characterized by at least one fundamental rheological property such as elasticity or viscosity. The types of rheological materials referred herein include, but are not limited to, gels, pastes, inks, concentrated solutions, suspensions, Newtonian and non-Newtonian fluids, viscoelastic solids (elastic solids which exhibit some viscous effects) and elasticoviscous fluids (viscous fluids which show some elastic behavior). Hereafter, a "fluid" or a "rheological fluid" is equivalent to a "rheological system" as defined above.

The laser energy 14 has sufficient energy to locally heat a very small volume of the rheological fluid adjacent to the support surface 32, vaporizing a small amount of the rheological fluid. This evaporated rheological fluid generates a high-pressure burst that propels the non-evaporated rheological fluid at the defined target location across the gap between the target substrate 17 and the receiving substrate 18. In this fashion the rheological fluid is transferred over the surface of the receiving substrate 18 at a defined receiving location over an area proportional to the area illuminated on the target substrate 17 by the laser energy 14. The transferred rheological fluid on the receiving substrate 18 is referred to as a deposit 26.

Unless otherwise stated, all steps can be performed in any sequence that results in a deposit 26 on the receiving substrate 18. Typically, the method is controlled by a computer, including the firing of the laser and the positioning of the components. Typically, the method is carried out at about room temperature and about atmospheric pressure. The method can also be carried out within an enclosure with controlled gases and pressures.

Figure 2A:
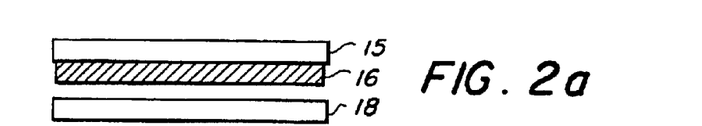
FIGS. 2a and 2b are schematic representations of the laser-transparent support 15, the coating 16, and the receiving substrate 18 before (2a) and after (2b) the depositing of the rheological fluid on the receiving substrate 18 to form a deposit 26.
Figure 2B:
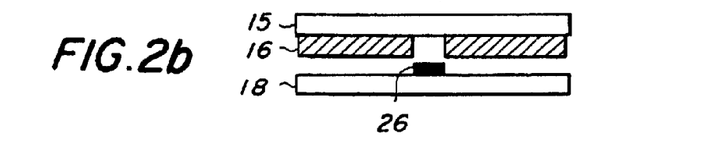

FIGS. 2a and 2b schematically illustrate the effects of exposing the target substrate to the laser energy 14, whereby the rheological fluid is propelled from the surface of the target substrate 17 and deposited onto the receiving substrate 18 forming the deposit 26.

The use of rheological materials with this technique allows almost any functional material in the form of powders, flakes, or other particles to be integrated into a system with the correct rheology for proper laser transfer and deposition of high-quality materials. The method is compatible with pastes, gels, and inks used for the screen printing, ink-jetting, etc. of discrete and active or passive electronic devices such as interconnects, vias, transmission lines, capacitors, resistors, inductors, antennae, sensors, transducers, three- and four-terminal devices, etc.

The use of laser forward transfer of rheological fluids offers many advantages. The method can produce patterns with superior electronic properties. Very small volumes of fluids (in the picoliter range) can be deposited with high resolution (in the 10's of microns). Layers composed of mixtures of solids and liquid phases in the form of homogenous dispersions can be deposited. Structures with unique density distributions can be made by utilizing the rheological properties of the transferred fluid. The use of lasers offers the advantages of high speed, well-defined spatial and temporal control, and a highly concentrated energy source whose properties (e.g. wavelength, fluence, intensity, and polarization) can be tailored to the properties of the rheological system. The method uses laser fluences generally lower than those required by other laser transfer processes, such as LIFT. This results in little or no laser damage to the functional material. The method can solve problems such as adhesion, debris, and conformal coverage by the rheological fluid by virtue of the ability of the fluids to adhere to, cover, and fill any type of surface, due to tailored rheological properties. Complete merging of the separately transferred adjacent deposits can be obtained. The method also allows for higher density and linewidth definition in the transferred material due to the improved and higher packing density of powders in a rheological fluid.

Additional Exposures

The method can comprise an additional step that enables the use of coatings 16 that are not necessarily as desirable for use in the basic method. Such coatings 16 comprise materials referred to as rheology precursors. A rheology precursor is a material whose initiation, degree, and duration of desired rheological properties (e.g. viscosity) can be activated by an external stimulus as required. The rheology precursor may or may not be a rheological fluid, but it typically does not have the desired or optimal rheological properties for laser transfer. A first exposure converts the rheology precursor to the rheological fluid, and a second exposure transfers the rheological fluid to the receiving substrate 18. The two exposures may be produced by a single laser 12 or by two different lasers 12.

The additional step is exposing the coating 16 to laser energy 14 through the laser-transparent support at the defined target location comprising a rheology precursor such that the rheology precursor is converted to the rheological fluid. The rheological fluid can then be transferred to the receiving substrate 18 as described above.

The uses of the dual exposure approach include, but are not limited to, two cases. In the first case, the rheology precursor is a primary component of the coating 16 on the laser-transparent support 15. It may only be able to be coated onto the target substrate 17 in a highly viscous form. The first exposure heats the rheology precursor at the defined target location to lower its viscosity so that it becomes a rheological fluid with desired rheological properties. The second exposure strikes the rheological fluid at the same defined target location, and is able to transfer the rheological fluid onto the receiving substrate 18 with better definition and higher density due to its lowered viscosity.

In the second case, the rheology precursor can be a material added and distributed uniformly throughout the coating 16. Upon first laser exposure, the desired rheology of the rheology precursor and therefore coating would be "activated" before transfer to the receiving substrate 18. For example, the coating 16 may first be made as a solid layer containing a rheology precursor, for example terpineol crystals, dispersed throughout. The first exposure will locally melt the terpineol crystals thereby changing the local rheological properties. The second exposure transfers this local rheological system to the receiving substrate 18. This method allows the desired rheological properties of the coating 16 to be activated only when needed and minimizes undesired long-term changes in rheology of the overall coating 16 on the target substrate 17 thus extending its shelf-life.

Regardless of whether the coating 16 initially comprises a rheological fluid or a rheology precursor, the method can comprise an additional step of exposing the deposit 26 to laser energy 14. The laser energy 14 alters the properties (including, but not limited to, rheology) of the deposit 26. (For example, see U.S. patent application Ser. No. 09/619,442, incorporated herein by reference.) The two exposures may be produced by a single laser 12 or by two different lasers 12. This step can comprise laser trimming for the removal of excess material and modifying the final pattern. The technique of laser trimming is known in the art.

Micromachining

Figure 1B:
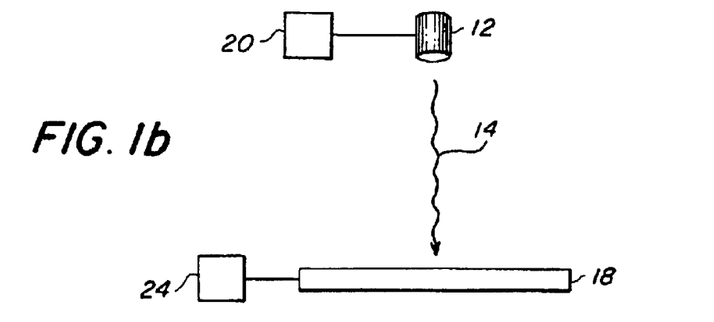
FIG. 1b is a schematic representation of the MAPLE-DW apparatus when used to micromachine away or laser-surface-treat a portion of the receiving substrate 18 or the deposit 26.
Figure 3A:
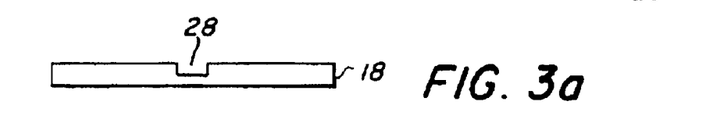

An additional step can be performed to micromachine away portions of the receiving substrate 18. This can be done by exposing the receiving substrate 18 to laser energy 14 to machine away a defined machining location 28 on the receiving substrate 18. This can be done before and/or after the transfer of the rheological fluid. FIG. 1b schematically illustrates the apparatus used to carry out this method. The laser energy 14 directly strikes the receiving substrate 18 without a target substrate 17 in between. This can be done with the same laser 12 as is used for exposing the rheological fluid, or a different laser 12. FIG. 3a schematically illustrates the resulting defined machining location 28 on the receiving substrate 18.

An additional step can be used to micromachine away portions of the deposit 26. This can be done by exposing the deposit 26 to laser energy 14 to machine away a defined machining location 28 on the deposit 26. This is essentially the same method as above except that it occurs after the deposit 26 is on the receiving substrate 18.

Figure 3B:
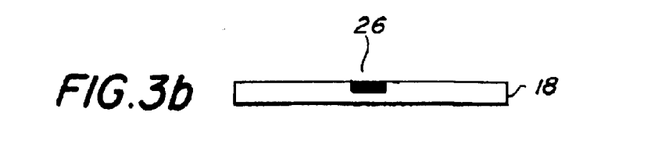

The above micromachining methods can also be used to micromachine a via, or small hole, all the way through the receiving substrate 18. Micromachining can also be used to make a trench on or through the receiving substrate, an elevated feature on the receiving substrate, and a depressed feature on or through the receiving substrate 18. Micromachining is also useful for laser-surface-treating the receiving substrate 18 or deposit 26. Such treatments include, but are not limited to, roughening and creating contours. In another embodiment, the rheological fluid is deposited directly into a defined machining location 28 already micromachined away by laser energy 14. FIG. 3b schematically illustrates the resulting deposit 26 in a defined machining location 28 on the receiving substrate 18.

Laser

Any suitable laser 12 may be used in the present invention. The term "laser" can refer to any device that produces laser energy 14. Typically, the laser 12 is a source of coherent electromagnetic energy generated by any means known in the art. Lasers 12 for use in accordance with the present invention can be any type generally used with other types of laser deposition. In general, a pulsed laser is preferred. A continuous wave laser is also suitable. A pulsed laser has the advantage of generating a very short burst of laser energy 14 that avoids damage to the coating 16. Pulsed lasers are commercially available within the full spectral range from UV to IR. Typically, such lasers emit light having a wavelength in the range of about 157–10600 nm, a pulsewidth of about $10^{-12}$–$10^{-6}$ second and a pulse repetition frequency of about 0 to greater than 100,000 Hz. Examples of suitable lasers 12 include, but are not limited to, excimer lasers operating at 193 and 248 nm and frequency quadrupled or tripled Nd:YAG laser operating at 266 and 355 nm. The fluence of the laser energy 14 is chosen such as to be sufficient to evaporate a small fraction of rheological fluid at the support surface/back surface 32/34 interface without causing the rest of the coating 16 to heat up above its drying temperature. Typical laser fluences range from about 0.01 to about 1 $J/cm^2$.

The dimensions of the laser energy 14 can be controlled by any means known in the art so that only a precisely defined area of the target substrate 17 is exposed to the laser energy 14 and so that only a precisely defined portion of the coating 16 is exposed. The laser energy 14 can be focussed through an objective or lens to narrow the beam and expose a smaller portion of coating 16. This increases the possible resolution of the deposit 26.

Positioning of Components

The receiving substrate 18 should be positioned so that when the rheological fluid is propelled from the laser-transparent support 15, the rheological fluid is deposited at a defined receiving location on the receiving substrate 18. It may be desirable to provide enough space between the target substrate 17 and the receiving substrate 18 so that volatilized rheological fluid can escape from the space between the target substrate 17 and the receiving substrate 18. Typically, the receiving substrate 18 is positioned about 10 to about 100 µm from the surface of the coating 16.

Typically, the laser 12, receiving substrate 18, and target substrate 17 are positioned through the use of one or more positioning means selected from the group consisting of a laser positioning means 20, a target substrate positioning means 22, and a receiving substrate positioning means 24. These positioning means allow for selecting the defined target location, defined receiving location, and defined machining location 28. They can be any positioning means known in the art for supporting a laser 12, a target substrate 17, and a receiving substrate 18 and moving them in a controlled and defined manner. For example, similar positioning means and moving means for a laser, target substrate, and receiving substrate are known in the fields of laser transfer deposition and laser induced forward transfer. The laser 12 may be positioned in any location that provides an optical path between the laser 12 and the target substrate 17 so that sufficient laser energy 14 can be directed to the defined target location on the target substrate 17. It is not always necessary to use all three positioning means. It is only necessary to control the relative positions of the components such that the laser energy 14 strikes the coating 16 at the desired defined target location, and the rheological fluid is deposited on the receiving substrate 18 at the desired defined receiving location.

Transfer of Patterns

To transfer a pattern, the laser 12, target substrate 17, and the receiving substrate 18 should be moveable with respect to each other. It should be arranged so that rheological fluid can be deposited in a pattern. After the rheological fluid is transferred from one defined target location on the target substrate 17, the laser energy 14 can be directed to another defined target location on the target substrate 17 from which the rheological fluid has not yet been transferred. The rheological fluid can be deposited in a two-dimensional pattern or a three-dimensional pattern of deposit 26. This is done by repeating the step of exposing the coating 16 at successive defined target locations and successive defined receiving locations. This creates multiple instances of deposit 26 that can be placed in any two-dimensional pattern or three-dimensional pattern desired. A three-dimensional pattern can be created by placing deposit 26 on top of deposit 26 already on the receiving substrate 18.

To increase the thickness of deposit 26 at a particular defined receiving location, the laser 12 and the receiving substrate 18 are held stationary with respect to each other and the target substrate 17 is moved with respect to the laser 12 and the receiving substrate 18. The laser energy 14 is directed to a new defined target location on the target substrate 17 from which the rheological fluid has not yet been transferred. The rheological fluid is deposited onto the same defined receiving location on the receiving substrate 18 in an increasingly thickened deposit 26. (As used herein, the terms "moving [a] with respect to [b]" or "moving [a] and [b] with respect to each other" mean that either [a] or [b] can be moved to effect a change in their relative position.)

In another embodiment the step of providing a target substrate 17 is performed one or more times. The target substrates comprise at least two different coatings 16. The coatings 16 can comprise any combination of rheological fluids or rheology precursors. The different rheological fluids obtained from the different coatings 16 are deposited in respective patterns on the receiving substrate. With this method two or more rheological fluids can be combined on one receiving substrate 18 in any desired combination of patterns. The apparatus of the present invention can be adapted so that a plurality of different rheological fluids can be deposited consecutively onto a receiving substrate 18 by consecutively moving each target substrate 17 into a position for depositing rheological fluid from a particular target substrate 17 onto the receiving substrate 18. Consecutive deposition of different rheological fluids can also be accomplished by providing a target substrate 17 that is subdivided into a plurality of different subregions that each have a different coating 16 and providing a way to select a particular subregion and deposit the rheological fluid from that subregion onto the receiving substrate 18. This allows the deposition of multi-component structures on the receiving substrate 18.

Substrates

The laser-transparent support 15 is typically planar, having a support surface 32 in contact with the coating 16 and a rear surface 30 that is positioned so that the laser energy 14 can be directed through the laser-transparent support 15. The composition of the laser-transparent support 15 is selected in accordance with the particular type of laser 12 that is used. For example, if the laser 12 is a pulsed UV laser, the laser-transparent support 15 may be an UV-transparent material including but not limited to quartz or machine-etched quartz. If the laser 12 is an IR laser, the laser-transparent support 15 may be an IR-transparent material including, but not limited to plastic, silicon, fused silica, or sapphire. Similarly, if the laser 12 is a visible laser, the laser-transparent support 15 may be a material that is transparent in the visible range, including, but not limited to soda lime and borosilicate glasses. Other suitable laser-transparent supports include, but are not limited to, germanium, selenides, fluorides, chlorides, tellurides, bromides, iodides, sulphides, and period II–VI compounds. A laser-transparent flexible polymer ribbon can also be a suitable laser-transparent support 15.

The coating 16 can be coated on the laser-transparent support 15 by numerous techniques, including but not limited to spin coating, spray coating, dipping, doctor blading, roller coating, and screen-printing. The surface of the target substrate 17 can be broken into separate regions with different coatings 16 in order to be able to deposit different rheological fluids without having to change the target substrate 17. Typical coatings 16 have uniform thickness and are from about 1 to about 20 microns thick.

The receiving substrate 18 can be any solid material, planar or non-planar, onto which one may wish to deposit the rheological fluid.

Coating

One important element for this method is the choice of coating 16 on the target substrate 17. Preferably, the coating 16 comprises paste, gel, or ink. The pastes, gels, or inks are homogeneous mixtures comprising one or more of the following: functional materials, solvent or vehicle, chemical and rheology precursors, binders, surfactants, dispersant agents, powders, and biomaterials.

Typically, the functional materials can consist of powders ranging in size from about 10 nanometers to about 10 microns and are responsible for the electrical, magnetic, actuating, or sensing properties of the deposit 26 or processed deposit. A functional material, as used in this invention, is a material that possesses an intrinsic property or properties integral to the proper functioning of any variation or combination of an active electronics, magnetic, optical, chemical, biological, actuating, or metrological application. Its properties are sensitive to chemical purity, physical structure, and surface morphology. Because these intrinsic properties of the functional material must be preserved as much as possible after the transfer, the choice and design of the rheological fluid layer become critical in the success of any final application. The properties of the functional materials can be adjusted or enhanced by the use of chemical precursors. In order to preserve a homogeneously dispersed mixture of powders of different types and sizes and various chemical precursors, appropriate organic vehicles, solvents, and binders can be used. Organic vehicles, solvents, and binders can also be used to tailor the rheological properties.

Examples of powders include metals, ceramics, cermets, dielectrics, ferroelectrics, piezoelectrics, ferrites, electro-optical and optical materials, ceramic superconductors, chalcogenides, carbides, silicides, nitrides, borides, semiconductors, polymers, conductive polymers, semiconductive polymers, electroluminescent polymers, biomaterials, and composites. Examples of chemical precursors include metal organic precursors, hydrated metal alkoxides, and organometallic compounds. Examples of vehicles include organic solvents with low vapor pressures such as glycerin, ethylene glycol, terpineol, butyl carbitol, butyl carbitol acetate, propylene carbonate, and 1-methyl-2-pyrrolidinone. Examples of binders include ethyl and other types of cellulose, polymethyl methacrylate (PMMA), glass frit, and poly(vinylidene fluoride). Examples of dispersants include various soaps, menhaden fish oil, and phosphate ester oligomers. The organic solvents used as vehicles can have low vapor pressures in order to minimize their evaporation while the paste, gel, or ink resides in the target substrate, in order to avoid changes in the viscosity and rheology of the mixture. However, it is typically necessary that once the pastes, gels, or inks have been laser transferred, the vehicle can be removed either thermally or photothermally without contaminating or influencing the chemistry of the functional material and chemical precursors. Finally, temporary and/or permanent binders can also be added to the pastes. Temporary binders, such as ethyl cellulose, are used to improve the rheology of the pastes, gels, or inks. Once the pastes, gels, or inks have been transferred, the binders may be thermally or photothermally decomposed without contaminating the functional material. Permanent binders, such as glass frit, are used to bind the functional materials together and to the receiving substrate. The permanent binder might require higher temperatures for melting (>300° C.) and remains part of the transferred material after sintering. The previous examples are not intended to limit the scope of the invention.

The resulting pastes, gels, or inks can have a wide range of viscosities, i.e. water-like to thick paste-like, which can be tailored depending on the nature of the paste and the technique used to coat the target substrate. Typical viscosities are in the range of about 0.01 to about 100,000 cPs. The specific rheological properties of the fluid, such as viscosity, vapor pressure, polarizability, shear resistance, slippage, thixotropicity, etc., can have a strong effect on the transfer characteristics. These properties are not necessarily permanently modified during the transfer process. Although these properties may be temporarily modified during the transfer process, the changes in properties are predictable. Therefore they can be tailored for a specific application or to achieve the desired final properties of the transferred material.

Once transferred, the fluids can be treated, if necessary, using appropriate thermal, photothermal, or photolytic processes, resulting in materials that exhibit near bulk-like properties and are suitable for electronic, actuator, and sensing applications, among others. Once the paste, gel, or ink has been laser transferred, the vehicle and temporary binders can be removed by thermally or photothermally heating the receiving substrate 18 to moderate temperatures (i.e. 100 to 250° C.). After this initial drying step, the transferred material can be heated to higher temperatures (i.e. >250° C.) by the use of lasers or rapid thermal annealing treatments. This final step allows for the decomposition of the chemical precursors, while consolidating or densifying the functional materials and any permanent binders present, with little or no heating of the adjacent receiving substrate. Since the pastes, gels, or inks typically contain a high percentage by weight of functional materials in powder or other solid forms, this technique allows a dramatic increase in the mass of the material being transferred per laser energy exposure if compared to other laser forward transfer direct-write techniques such as LIFT. As a consequence, this invention allows for the transfer of material at relatively high rates when used with fast firing lasers, resulting in high writing speeds (over 100 mm/sec) which is very important for its use not only in prototyping but also in manufacturing environments.

The method of the invention is compatible with a broad variety of classes of materials. Furthermore, given the broad range of parameters offered by varying both the rheological properties of the fluid and the laser wavelength and fluence, it is possible to deposit materials with properties not available with any other currently available technique. For electronic applications, the transfer of pastes, gels, or inks with tailored rheological properties can be used to enhance the packing density, minimize spreading, i.e. increase resolution and improve the surface morphology of the resulting features, with the resulting gain in electronic properties. The use of a rheological fluid also allows the addition of adhesion promoters, binders, and agents that would improve the durability and reliability of the electronics components. In addition, the laser forward transfer of a rheological fluid more easily allows the transfer and deposition of materials on conformal (i.e. non-planar) surfaces. The rheological properties of the transferred fluid lend easily to coalescent behavior which gives rise to the unique properties and advantages of this invention.

Having described the invention, the following examples are given to illustrate specific applications of the invention. These specific examples are not intended to limit the scope of the invention described in this application.

EXAMPLE 1

Polymer Thick Film Resistor—Five types of epoxy-based polymer thick-film resistors with measured sheet resistances ranging from 35 Ω/sq to 115 kΩ/sq were MAPLE-DW transferred onto polished alumina substrates with good reproducibility. An UV laser operating at 355 nm with a 5 ns pulse width was focused onto a quartz disk that acted as the laser-transparent support. The target substrate was coated on one side by wire-wound roller with the PCR401 series of polymer thick film resistor paste (rheological fluid) from Metech, Inc. with a thickness of 5–8 μm. Polymer resistor pastes used for this study are based on a thermosetting epoxy resin with carbon black and graphite as the conducting phase. They are typically applied by thick film methods such as screen-printing. By using a rheological fluid coating on the target substrate and by optimizing the deposition parameters such as laser fluence (from 0.58 J/cm$^2$ to 1.09 J/cm$^2$) and target substrate to receiving substrate gap of approximately 70 μm, resistors with good morphology and line width were deposited. After deposition, the resistors were heated to 125° C. for 15 minutes to remove organic solvents followed by final curing at 210° C. for 30 minutes in a well-ventilated box oven.

DC resistance was measured with an Alessi REL4100A500 low frequency probe station and a Keithley 2400 source meter. The temperature coefficient of resistance for the resistors was measured in the temperature range of 25° C. to 125° C. using the Keithley source meter, Cascade thermal probe station, and Temptronics temperature controller. The specified resistance values (i.e. the sheet resistance specified by the vendor for 16 μm thick screen-printed film) for these 5 types of commercial resistors are 10 Ω/sq, 100 Ω/sq, 1 kΩ/sq, 10 kΩ/sq, and 100 kΩ/sq respectively. Average sheet resistances of 35.3 Ω/sq, 96.9 Ω/sq, 1.21 kΩ/sq, 22.5 kΩ/sq, and 115.6 kΩ/sq respectively with the coefficient of variation (i.e., the standard deviation expressed as a percentage of the average value) being less than 20% were obtained. The maximum temperature coefficient of resistance measured for these five types of polymer resistors are 680 ppm/° C., 155 ppm/° C., 595 ppm/° C., 465 ppm/° C., and 720 ppm/° C., respectively.

EXAMPLE 2

Cermet Thick Film Resistor—Four types of cermet thick film resistors with measured sheet resistances ranging from 6 Ω/sq to 40 kΩ/sq were MAPLE-DW transferred onto polished alumina substrates with good reproducibility. An UV laser operating at 355 nm with a 5 ns pulse width was focused onto a quartz disk that acted as the laser-transparent support. The laser transparent support was coated on one side by wire-wound roller with the 2000 series of cermet thick film resistor paste from DuPont, Inc. with a thickness of 2–3 μm. Cermet resistor pastes used for this study are composed of inorganic powders of conducting metals, metal oxides, and fritted glass suspended in organic solvents. They are typically applied by thick film methods such as screen-printing. By using this rheological fluid on the target substrate and by optimizing the deposition parameters such as laser fluence (from 0.48 J/cm$^2$ to 0.58 J/cm$^2$) and target to acceptor substrate gap of 65 μm, resistors with good morphology and line width were deposited. After deposition the resistors were heated to 150° C. for 15 minutes to remove organic solvents followed by final curing at 850° C. for 10 minutes in a well-ventilated box oven.

DC resistance was measured with an Alessi REL4100A500 low frequency probe station and a Keithley 2400 source meter. The temperature coefficient of resistance for the resistors was measured in the temperature range of −55° C. to 125° C. using the Keithley source meter, Cascade thermal probe station, and Temptronics temperature controller. The specified resistance values (i.e. the sheet resistance specified by the vendor for a 20 μm thick screen-printed film) for these 4 types of commercial resistors are 10 Ω/sq, 100 Ω/sq, 10 kΩ/sq, and 100 kΩ/sq respectively. Average sheet resistances of 6.0 Ω/sq, 66.6 Ω/sq, 5.6 kΩ/sq, and 40.0 kΩ/sq respectively with the coefficient of variation being less than 11% were obtained. The maximum temperature coefficients of resistance measured for these four types of cermet resistors are 308 ppm/° C., 116 ppm/° C., 77 ppm/° C., and 130 ppm/° C., respectively.

EXAMPLE 3

High-k Dielectric—(Note: k is the relative dielectric constant.) Using a method similar to that described in the previous examples, two types of high-k dielectric thick film (i.e., specified k=3000 and k=1500) were MAPLE-DW transferred onto metallized (200 Å Cr/3 μm Ag/500 Å Pt) alumina substrates. The UV transfer laser wavelength was 355 nm and the focal spot diameter was 65 μm. Dielectric pastes used for this study were $PbMg_{1/3}Nb_{2/3}O_3$, based dielectric paste IP9333 (k=3000) and IP9331.5 (k=1500) obtained from Heraeus, Inc. These pastes are typically applied by thick film methods such as screen-printing. By using this rheological fluid on the target substrate and by optimizing the deposition parameters such as laser fluence (0.75 J/cm$^2$) and target to acceptor substrate gap of 90–100 μm, three layers of dielectrics with good morphology were deposited. The deposition of three layers of dielectric with each layer being individually fired was required in order to achieve isolation between conductor layers. Each layer was heated to 150° C. for 15 minutes to remove organic solvents followed by final curing at 850° C. for 10 minutes in a well-ventilated box oven. Finally, top electrodes (200 Å Cr/3 μm Ag/500 Å Pt) were deposited by e-beam evaporation with a Kapton photomask to form several "stealth" decoupling capacitors (i.e., two parallel-plate capacitors connected in series with the connection between them through the bottom electrode).

The capacitance and dissipation factor of the decoupling capacitors were measured at frequencies ranging from 1 MHz to 1.8 GHz using a HP4291B impedance analyzer, a Cascade Microtech Summit 11651-6 thermal probe station, and a Cascade Microtech air coplanar microwave probe. The dielectric constant, k, was extracted from the measured capacitance value. Since the conductor loss of the capacitor is negligible, the measured dissipation factor was attributed to the loss tangent of the dielectric. The specification of k for Heraeus IP9333 and 11P9331.5 are k=3000±600 and k=1500±300 at 1 kHz respectively. Dielectric constants of 1863 and 1877 and loss tangents of 0.042 and 0.034 at 1 MHz respectively were obtained. In addition, these two dielectric films showed a dielectric constant tuning of 2.5% and 1.0% respectively with a DC bias electric field of ~8 kV/cm.

We claim:

1. A method for laser deposition comprising the steps of:
   providing a receiving substrate;
   providing a target substrate;
   wherein a gap exists between the receiving substrate and the target substrate;
   wherein the target substrate comprises a laser-transparent support coated with a coating on a surface facing the receiving substrate; and
   exposing the coating to laser energy through the laser-transparent support at a defined target location comprising a rheological fluid to evaporate a portion of the rheological fluid adjacent to the laser-transparent support at the defined target location;
   wherein the non-evaporated rheological fluid at the defined target location is propelled by the evaporated rheological fluid away from the laser-transparent support and toward the receiving substrate; and
   wherein the non-evaporated rheological fluid is deposited at a defined receiving location on the receiving substrate to form a deposit.

2. The method of claim 1, wherein the method is controlled by a computer.

3. The method of claim 1,
   wherein the steps are carried out at about room temperature; and
   wherein the steps are carried out at about atmospheric pressure.

4. The method of claim 1, wherein the laser is selected from the group consisting of a pulsed laser and a continuous wave laser.

5. The method of claim 1, wherein laser energy is focussed through an objective or lens.

6. The method of claim 1,
wherein the step of exposing the coating is repeated at successive defined target locations and successive defined receiving locations; and
wherein the deposit is in a two-dimensional pattern or a three-dimensional pattern.

7. The method of claim 1,
wherein the step of providing a target substrate is performed one or more times:
wherein the target substrates comprise at least two different coatings; and
wherein different rheological fluids obtained from the different coatings are deposited in respective patterns on the receiving substrate.

8. The method of claim 1, wherein the laser-transparent support comprises one or more materials selected from the group consisting of fused silica, quartz, machine-etched quartz, sapphire, soda lime glass, borosilicate glass, silicon, germanium, selenides, fluorides, chlorides, tellurides, bromides, iodides, sulphides, period II–VI compounds, and plastic.

9. The method of claim 1, wherein the laser-transparent support composes a laser-transparent flexible polymer ribbon.

10. The method of claim 1, wherein the receiving substrate comprises a non-planar surface.

11. The method of claim 1, wherein the rheological fluid is in a form selected from the group consisting of paste, gel, ink, concentrated solutions, suspensions, Newtonian fluids, non-Newtonian fluids, viscoelastic fluids, and elasticoviscous fluids.

12. The method of claim 1, wherein the coating comprises one or more materials selected from the group consisting of metals, ceramics, cermets, dielectrics, ferroelectrics, piezoelectrics, ferrites, electro-optical materials, optical materials, ceramic superconductors, chalcogenides, carbides, silicides, nitrides, borides, semiconductors, polymers, conductive polymers, semiconductive polymers, electroluminescent polymers, biomaterials, and composites.

13. The method of claim 1, wherein the coating comprises one or more materials selected from the group consisting of metal organic precursors, hydrated metal alkoxides, and organometallic compounds.

14. The method of claim 1, wherein the coating comprises one or more materials selected from the group consisting of glycerin, ethylene glycol, terpineol, butyl carbitol, butyl carbitol acetate, propylene carbonate and 1-methyl-2-pyrrolidinone.

15. The method of claim 1, wherein the coating comprises one or more materials selected from the group consisting of ethyl cellulose, cellulose compounds, polymethyl methacrylates, poly(vinylidene fluoride), and glass frit.

16. The method of claim 1, wherein the coating comprises one or more materials selected from the group consisting of soaps, menhaden fish oil, and phosphate ester oligomers.

17. The method of claim 1 comprising the following additional step;
exposing the deposit to laser energy;
wherein laser energy alters the properties of the deposit.

18. The method of claim 17, wherein one laser is used to transfer the rheological fluid, and a different laser is used to expose the deposit.

19. The method of claim 1 comprising the following additional step:
exposing the receiving substrate to laser energy to machine away a defined machining location on the deposit.

20. The method of claim 19, wherein the defined machining location comprises a structure selected from the group consisting of a via through the receiving substrate, a trench on or through the receiving substrate, an elevated feature on the receiving substrate, and a depressed feature on or trough the receiving substrate.

21. The method of claim 1, wherein the coating comprises one or more materials selected from the group consisting of functional materials, solvents, vehicles, chemical precursors, rheology precursors, binders, surfactants, dispersants, powders, and biomaterials.

22. The method of claim 21, wherein the functional material comprises one or more materials that possess an intrinsic property or properties integral to the proper functioning of any variation or combination of an active electronics, magnetic, optical, chemical, biological, actuating, or metrological application.

23. The method of claim 1 comprising the following additional step:
exposing the receiving substrate to laser energy to machine away a defined machining location on the receiving substrate.

24. The method of claim 23, wherein the defined machining location comprises a structure selected from the group consisting of a via through the receiving substrate, a trench on or through the receiving substrate, an elevated feature on the receiving substrate, and a depressed feature on or through the receiving substrate.

25. The method of claim 23, wherein the rheological fluid is deposited into the defined machining location.

26. The method of claim 1 comprising the following additional step:
exposing the coating to laser energy through the laser-transparent support at the defined target location comprising a rheology precursor such that the rheology precursor is convened to the rheological fluid.

27. The method of claim 26, wherein the rheology precursor is material whose initiation, degree, and duration of desired rheological properties can be activated by an external stimulus.

28. The method of claim 26, wherein the rheology precursor is a primary component of the coating.

29. The method of claim 26, wherein one laser is used to convert the rheology precursor to the rheological fluid, and a different laser is used to transfer the rheological fluid.

* * * * *